(12) United States Patent
Takahashi

(10) Patent No.: US 6,716,904 B2
(45) Date of Patent: Apr. 6, 2004

(54) HEAT-RADIATING ELECTROMAGNETIC WAVE ABSORBER

(75) Inventor: Kouya Takahashi, Tokyo (JP)

(73) Assignee: Polymatech Co., Ltd., Tokyo (JP)

( * ) Notice: Subject to any disclaimer, the term of this patent is extended or adjusted under 35 U.S.C. 154(b) by 0 days.

(21) Appl. No.: 10/171,130

(22) Filed: Jun. 13, 2002

(65) Prior Publication Data

US 2003/0008969 A1 Jan. 9, 2003

(30) Foreign Application Priority Data

Jun. 15, 2001 (JP) ............................ 2001-181871

(51) Int. Cl.[7] .................................................. C08K 3/34
(52) U.S. Cl. .................... 524/442; 524/439; 524/440; 524/441; 524/588; 252/62.51 R; 252/62.55
(58) Field of Search ............................... 524/439, 440, 524/441, 442, 588; 252/62.51 R, 62.55

(56) References Cited

U.S. PATENT DOCUMENTS

| | | | | |
|---|---|---|---|---|
| 6,284,363 | B1 | 9/2001 | Maeda et al. | 428/328 |
| 6,514,428 | B2 * | 2/2003 | Suzuki et al. | 252/74 |
| 6,617,038 | B2 * | 9/2003 | Sakurai et al. | 428/447 |

OTHER PUBLICATIONS

Honma et al., "Zisei–zairyou Dokuhon", Kogyo Chosakai Publishing Col, Ltd., 1998 and partial translation of L1–6, p. 89.

* cited by examiner

*Primary Examiner*—Robert Dawson
*Assistant Examiner*—Marc Zimmer
(74) *Attorney, Agent, or Firm*—Fish & Richardson P.C.

(57) ABSTRACT

A heat-radiating electromagnetic wave absorber molded in a predetermined form from a mixed composition comprising Fe—Si alloy powder as soft magnetic powder and a thermally conductive filler in an organic matrix. This heat-radiating electromagnetic wave absorber has better thermal conductivity, as well as excellent electromagnetic wave absorbing property in high frequency band.

17 Claims, 2 Drawing Sheets

HEAT-RADIATING ELECTROMAGNETIC WAVE ABSORBER

CROSS REFERENCE TO RELATED APPLICATIONS

Pursuant to 35 USC §119, this application claims the benefit of Japan Patent Application No. 2001-181871 filed Jun. 15, 2001.

BACKGROUND OF THE INVENTION

The present invention relates to a heat-radiating electromagnetic wave absorber that is used in electronic products, such as information, imaging, and mobile communication equipments. More specifically, the present invention relates to a heat-radiating electromagnetic wave absorber that damps and absorbs electromagnetic noise generated by electronic components while dissipating heat produced by the devices.

Recently, digital electronic equipments and other electronic products employing the quasi-microwave band (100 MHz–3 GHz) and higher frequency ranges have come into wide use. Such products are mounted with electronic components in a high-density due to requirements of compactness and high performance. Such high-density mounted electronic products may have problems, such as electromagnetic wave hindrance or interference caused by the electromagnetic noise generated at the devices or decrease of properties due to heat. Therefore, it has been an important subject to deal with these problems.

In order to avoid the above problems, electromagnetic wave absorbers are used to damp and absorb the electromagnetic noise. Thermally conductive sheets (thermally conductive molded materials) are also used to effectively dissipate heat produced at the electronic components to the outside.

The recent high performance exothermic electronic components need countermeasures for both electromagnetic noise and heat at the same time. For such case, use of both materials, an electromagnetic noise absorber and an thermally conductive molded material, is cost consuming due to increased number of parts, and requires a larger mounting space.

To deal with above disadvantages, U.S. Pat. No. 6,284, 363 proposes an electromagnetic wave absorbing thermally conductive silicone gel molded sheet, which absorbs electromagnetic waves and dissipates heat with a single member. This silicone gel sheet is formed from a silicone gel composition comprising metal oxide magnetic particles and a thermally conductive filler.

The silicone gel sheet proposed by above patent, however, uses Mn—Zn (Manganese-Zinc) ferrite or Ni—Zn (Nickel-Zinc) ferrite, which have low thermal conductivity, as metal oxide magnetic particles. Thus the sheet has less thermal conductivity than existing thermally conductive sheets dispersed with only thermally conductive fillers, and does not have sufficient heat radiating properties.

Moreover, the current silicone gel sheet mentioned above has a disadvantage that the permeability of the sheet will decrease at high frequency band over 300 MHz, due to a restriction called "Snoek's Limit", since the sheet uses Spinel type of Mn—Zn or Ni—Zn ferrites as metal oxide magnetic materials.

The following description describes the damping effect of electromagnetic noise for metal oxide magnetic materials based on Snoek's equation given by equation (1).

$$f_r(\mu'-1) = I_s \cdot \gamma / 3\pi\mu_0 \quad (1)$$

($f_r$: resonance frequency, $\mu'$: real part of complex specific permeability, $\gamma$: gyromagnetic ratio, $\mu_0$: permeability in a vacuum, $I_s$: saturation magnetization)

When a magnetic material is magnetized while increasing the frequency from a low frequency to a high frequency, the material generally causes domain wall displacement and rotational magnetization. The magnetic material becomes unable to follow the magnetic field change under certain frequency magnetism, then the material causes a magnetic resonance. The frequency at which this occurs is referred to as a resonance frequency $f_r$. When a permeability of the magnetic material depends on frequency, the complex specific permeability U can be represented as $U=\mu'-i\mu''$. This complex part $\mu''$ expresses a delay of magnetization at a alternating magnetic field, and corresponds to a magnetic loss. As the magnetic material is magnetized while increasing the frequency, the real part $\mu'$ of the complex specific permeability decreases, while the imaginary part $\mu''$ of the permeability increases. The imaginary part $\mu''$ becomes a maximum at the resonance frequency $f_r$. Consequently, a possible frequency band range where the magnetic materials can be used as electromagnetic wave absorbers is in a band where the materials have a large magnetic loss, that is, in higher frequency band than the $f_r$ of the material where the $\mu''$ is higher while the $\mu'$ is lower ($\mu''>\mu'$). On the other hand, the electromagnetic noise damping effect decreases in the range where $\mu''$ is far from the $f_r$ in the higher frequency side, because the $\mu''$ becomes too low in such ranges of high frequency.

The permeability of the Spinel type ferrite will now be discussed. Generally, the Spinel type ferrite has a small $f_r$ because of small saturation magnetization $I_s$. Such small $f_r$ of Spinel type ferrite, lower than quasi-microwave band, results in the decreased permeability, causing the damping effect to be insufficient in the quasi-microwave band and higher frequency ranges.

Consequently, the current electromagnetic wave absorbing thermally conductive silicone gel sheet abovementioned does not have sufficient electromagnetic wave absorbing properties for the quasi-microwave band and higher frequency ranges, although the sheet has an improved electromagnetic wave absorbing properties for the range of 30 to 300 MHz. In other words, the current silicone gel sheet is not suitable to be used for the quasi-microwave band and higher frequency ranges.

The present invention aims to address the above disadvantages and its object is to provide a heat radiating electromagnetic wave absorber that has excellent electromagnetic wave absorbing properties in quasi-microwave and higher frequency ranges as well as thermal conductivity.

BRIEF SUMMARY OF THE INVENTION

The heat-radiating electromagnetic wave absorber is provided. The absorber is molded in a predetermined form from a mixed composition comprising soft magnetic powder and a thermally conductive filler in an organic matrix, wherein the soft magnetic powder includes Fe—Si (iron-silicon) alloy powder.

Other aspects and advantages of the invention will become apparent from the following description, taken in conjunction with the accompanying drawings, illustrating by way of example the principles of the invention.

BRIEF DESCRIPTION OF THE SEVERAL VIEWS OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
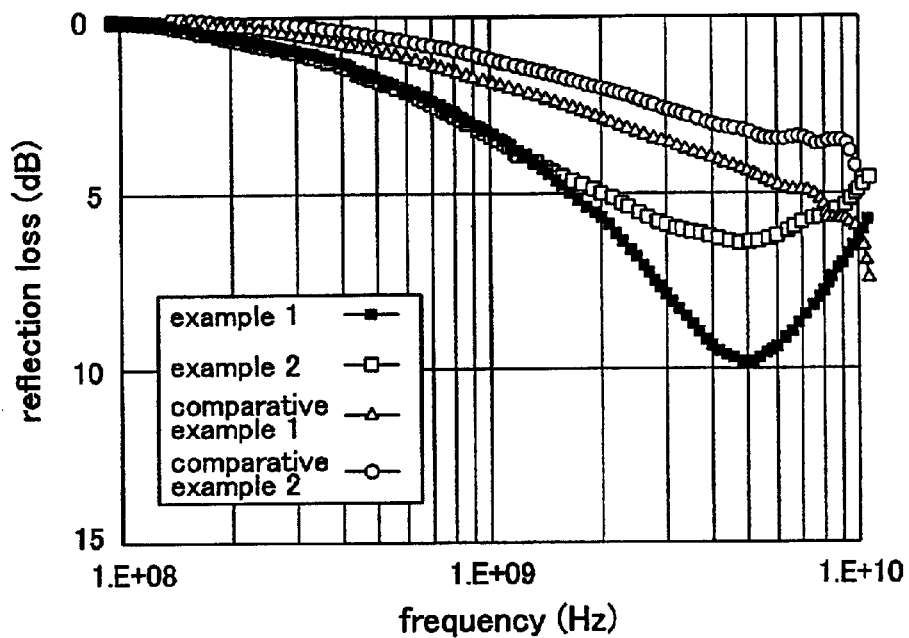
FIG. 1 is a semi-logarithm graph showing the return losses of the heat-radiating electromagnetic wave absorbers in example 1, 2, comparative example 1 and 2.

A heat-radiating electromagnetic wave absorbing sheet according to one embodiment of the present invention will now be described.

The heat-radiating electromagnetic wave absorbing sheet is formed by molding a mixed composition comprising a thermally conductive filler and Fe—Si (iron-silicon) alloy powder as soft magnetic powder in an organic matrix into the form of sheet.

The organic matrix is preferably selected from any known organic matrixes, for example, resins, gels, rubbers, and thermoplastic elastomers, depending on the required properties for application, such as mechanical strength, heat-resistance, and electric characteristics. The organic matrix does not have any limitations about its composition or method of curing. In consideration of adhesion and conformance to the electronic components, the organic material is preferably a silicone gel. For the matrix, a single material may be used, or more than one material may be blended together. Also the matrix may be alloyed.

The thermally conductive filler can be suitably selected from the group consisting of metal oxides, metal nitrides, metal carbonates and metal hydrides, and combinations thereof. Such fillers include aluminum oxide, zinc oxide, aluminum nitride, boron nitride, silicon nitride, silicon carbide, silica, and aluminum hydride. Alternatively, the thermally conductive filler can be suitably selected from the group consisting of silver, copper, gold, iron, aluminum, magnesium, their alloys and a combination of thereof, although it is not limited to them. The particle form and size of the filler are not defined specifically. The filler also may be processed with silane or titanate coupling agents to improve its compatibility with or dispersibility in the organic matrix.

The thickness of the sheet is preferably 0.2 mm to 5 mm. If the thickness is less than 0.2 mm, the sheet will encounter any difficulty in manufacturing and will not provide sufficient electromagnetic wave absorbing effect. On the other hand, a thickness over 5 mm causes poor thermally conductivity and increased cost.

Preferably, at least one surface of the sheet is adhesive. This allows the sheet to closely contact with the electronic components so that a relatively wide thermally conducting area can be created. The wide thermally conducting area physically improves the conductivity and reduces the leakage of the electromagnetic waves.

Moreover, in order to improve the workability, the strength, or the shielding properties against electromagnetic waves, a reinforcing layer or shielding layer in the form of sheet or fiber may be laminated on at least one side of the heat-radiating electromagnetic wave absorbing sheet. Alternatively, such layers may be embedded in the sheet.

In addition to the soft magnetic powder and the filler, the sheet may further comprise other additives, such as plasticizer, binder, reinforcer, colorant, heat-resistant improver, and the like. Other soft magnetic powders can be used with the Fe—Si alloy powder. Those other soft magnetic powders include, for example, Fe—Si—Al alloy (sendust) powder, Fe—Ni alloy (permalloy) powder, Mn—Zn ferrite powder, Ni—Zn ferrite powder, and Mg—An ferrite powder.

According to the present embodiment, the following advantages can be obtained.

Use of Fe—Si alloy powder as the soft magnetic powder can result in a heat-radiating electromagnetic wave absorbing sheet that has excellent electromagnetic wave absorbing properties in quasi-microwave band and higher frequency ranges, especially in 1 G Hz or more. This results from a degree of degrade in permeability of the sheet that is relatively small in the quasi-microwave band and higher frequency ranges since the $f_r$ of the Fe—Si alloy is in the quasi-microwave ranges. Furthermore, thermal conductivity of the Fe—Si alloy is better than that of the Spinel type ferrite abovementioned, and the Fe—Si alloy provides excellent thermal conductivity with the sheet. Thus, this heat-radiating electromagnetic wave absorbing sheet can be suitably used for various electronic components, which emit electromagnetic waves or heat, or are interfered by the electromagnetic waves, in the electronic products employing quasi-microwave band and higher frequency ranges that has been popularly used. This embodiment describes the present invention in the form of sheet, however, the invention is not limited in its form.

The content of silicon in the Fe—Si alloy powder should be from 5 to 7 percent by weight. If the content of silicon is less than 5 percent by weight, the sheet may be corroded by oxygen, which causes degradation of the electromagnetic wave absorbing properties and thermal conductivity. On the other hand, if the content of silicon is over 7 percent by weight, the Fe—Si alloys become rigid and fragile. This can give difficulty in processing. It is reported that Fe—Si alloys have high permeability while its crystal magnetic anisotropy and magnetostriction constant is close to zero when the content of silicon in the alloy is about 6 percent by weight (see Motofumi Honma, Akira Higuchi, "Zisei-zairyou Dokuhon", KOGYO CHOSAKAI PUBLISHING CO., LTD) Thus, the sheet can be provided with improved weather resistance, as well as excellent electromagnetic wave absorbing properties, by using Fe—Si alloys with from 5 to 7 wt % of silicon as soft magnetic powder for the sheet.

When the average particle size (major axis, if irregular shape, such as flakes) of Fe—Si alloy powder is in the range of 1 to 50 µm, the dispersibility of the powder is improved in an organic matrix. This allows the Fe—Si alloy powder to be charged into the organic matrix at a high level, so that the sheet can have better electromagnetic wave absorbing properties, as well as excellent heat dispersion. If the average particle size is less than 1 µm, the bulk specific gravity will increase. As the result, it becomes difficult to disperse the powder uniformly in the matrix. On the other hand, if the average particle size is over 50 µm, the ratio of a core (a remained part excepting a surface layer) of the powder will increase in comparison with the surface layer of the powder (a few of µm). The core does not contribute to damping of electromagnetic waves in quasi-microwave and higher frequency ranges, although the surface layer of the powder contributes to damping of the waves. Therefore, it will be difficult to effectively improve the electromagnetic wave absorbing properties even if such powder is highly charged in the matrix.

The content of Fe—Si alloy powder in the mixed composition should be from 5 to 70 percent by volume. This provides improved electromagnetic wave absorbing properties, as well as excellent heat radiation with the sheet. If the content of Fe—Si alloy powder is less than 5 percent by volume, the sheet cannot give sufficient electromagnetic wave absorbing properties. Addition of other soft magnetic powder to improve the absorbing properties may cause a decrease of the heat conductivity. When the content of Fe—Si alloy powder is over 70 percent by volume, the thermally conductive filler cannot be mixed into the matrix in sufficient amount and thermal conductive will decrease.

Use of silicone gel, which has better adhesion and conformance, as the organic matrix for the electromagnetic wave absorbing sheet can allow a sufficient contact between the sheet and electronic components to secure wider thermally conductive surface area and to reduce leakage of electromagnetic waves. Thus, a electromagnetic wave absorbing sheet can be obtained that is suitable for recent high performance electronic components with high mounting density.

The mixed composition, comprising a thermally conductive filler and Fe—Si alloy powder as soft magnetic powder, may be molded into a sheet to provide the heat-radiating electromagnetic wave absorber. Such a sheet absorber can cover electronic components from its sides and top, or plural components at the same time. This can reduce the number of components and provide higher efficiency in damping electromagnetic noise and heat dispersion of exothermic parts.

EXAMPLES

With reference of examples of the present invention and comparative examples for them, the embodiment of the heat-radiating electromagnetic wave absorbing sheet will be described in detail below, although the description is not intended to limit the scope of the present invention.

The electromagnetic wave absorbing properties of the examples and comparative examples are shown with return losses. The return losses are derived with reflection coefficients and transmission coefficients, which were respectively measured by using Network Analyzer HP8720 (manufactured by Hewlett-Packard). The thermal conductivities of the examples and comparative examples were measured by Portable Heat Flow Meter QTM-500 (manufactured by Kyoto Electronics Manufacturing Co., Ltd,). The viscosities of the mixed compositions were respectively measured by a rotational viscosity meter.

Example 1

100 weight part of addition type liquid silicone gel (manufactured by Dow Corning Toray Silicone Co., Ltd, with 1.0 of specific gravity) as an organic matrix was added with 900 weight part of Fe—Si alloy powder containing 6 wt % of silicon as a soft magnetic powder, and 275 weight part of silicon carbide (SiC) powder (with 3.1 of true specific and 60 μm of average particle size) as a thermally conductive filler and mixed by an agitating defoamer until homogenized to prepare the mixed composition (silicone gel composition).

The mixed composition contained 32 vol % of organic matrix, 28 vol % of silicon carbide, and 40 vol % of Fe—Si alloy powder.

This mixed composition, then, was hardened at 120° C. for 30 min. to produce a heat-radiating electromagnetic wave absorbing sheet with the thickness of 1 mm.

Example 2

The mixed composition was prepared in the same manner as Example 1, except using Fe—Si alloy powder containing 7 wt % of silicon (with 10 μm of average particle size) as the soft magnetic powder, to produce a heat-radiating electromagnetic wave absorbing sheet.

Example 3

The mixed composition was prepared in the same manner as Example 1, except using Fe—Si alloy powder containing 6 wt % of silicon (with 3 μm of average particle size) as the soft magnetic powder, to produce a heat-radiating electromagnetic wave absorbing sheet.

Example 4

The mixed composition was prepared in the same manner as Example 1, except using Fe—Si alloy powder containing 6 wt % of silicon (with 50 μm of average particle size) as the soft magnetic powder, to produce a heat-radiating electromagnetic wave absorbing sheet.

Example 5

The mixed composition was prepared in the same manner as Example 1, except that the mixed composition contained 32 vol % of organic matrix, 63 vol % of silicon carbide, and 5 vol % of Fe—Si alloy powder, to produce a heat-radiating electromagnetic wave absorbing sheet.

Example 6

The mixed composition was prepared in the same manner as Example 1, except that the mixed composition contained 32 vol % of organic matrix, 48 vol % of silicon carbide, and 20 vol % of Fe—Si alloy powder, to produce a heat-radiating electromagnetic wave absorbing sheet.

Example 7

The mixed composition was prepared in the same manner as Example 1, except that the mixed composition contained 32 vol % of organic matrix, 8 vol % of silicon carbide, and 60 vol % of Fe—Si alloy powder, to produce a heat-radiating electromagnetic wave absorbing sheet.

Comparative Example 1

The mixed composition was prepared in the same manner as Example 1, except using Mn—Zn ferrite (with 3 μm of average particle size) as the soft magnetic powder, to produce a heat-radiating electromagnetic wave absorbing sheet.

Comparative Example 2

The mixed composition was prepared in the same manner as Example 1, except using Fe—Si alloy powder containing 4.5 wt % of silicon (with 10 μm of average particle size) as the soft magnetic powder, to produce a heat-radiating electromagnetic wave absorbing sheet.

Comparative Example 7

The mixed composition was prepared in the same manner as Example 1, except that the mixed composition contained 32 vol % of organic matrix and 68 vol % of silicon carbide without Fe—Si alloy powder, to produce a heat-radiating electromagnetic wave absorbing sheet.

Figure 2:
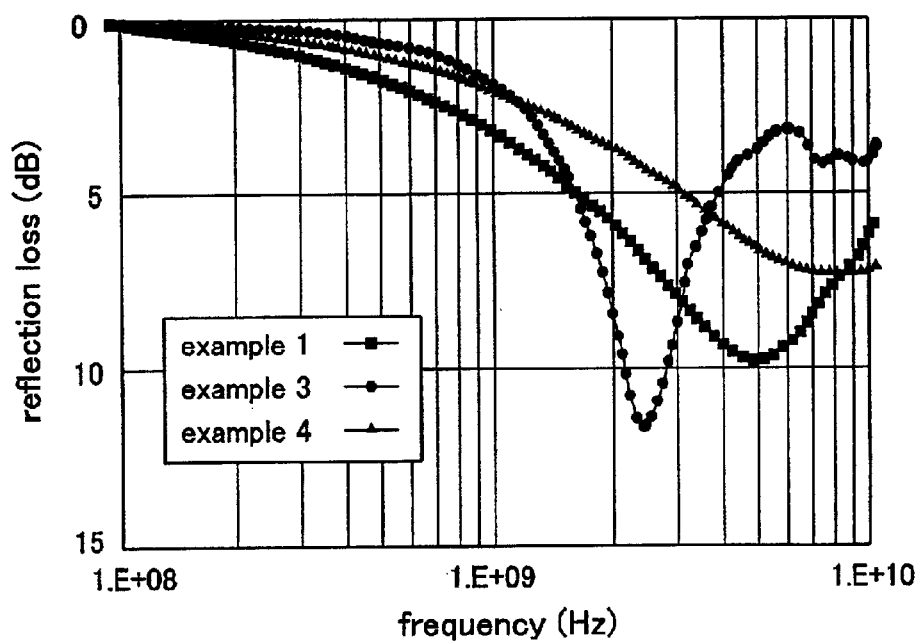
FIG. 2 is a semi-logarithm graph showing the return losses of the heat-radiating electromagnetic wave absorbers in example 1, 3, comparative example 3 and 4.
Figure 3:
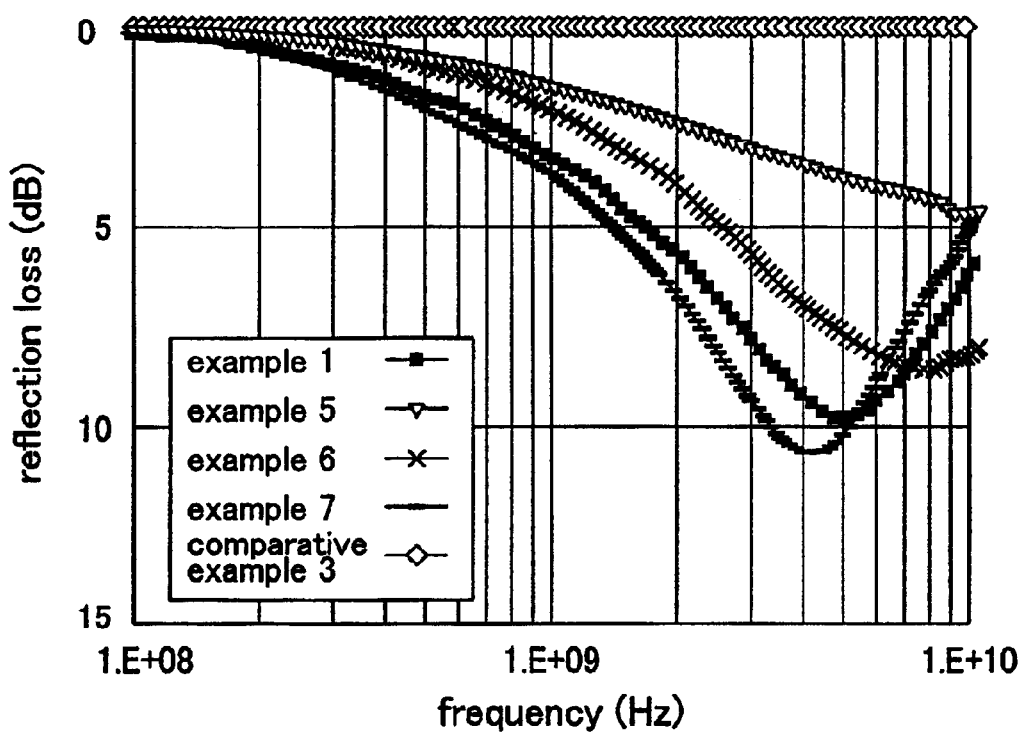
FIG. 3 is a semi-logarithm graph showing the return losses of the heat-radiating electromagnetic wave absorbers in example 1, 5–7, and comparative example 3.

Table 1 and 2 show viscosities of the mixed compositions and thermal conductivities of the sheets provided by the examples and comparative examples, which were measured at 25° C. Also, FIGS. 1 to 3 show measurements of return loss of the sheets by above examples and comparative examples. The larger this return loss, the electromagnetic wave absorbing property becomes better. In FIGS. 1 to 3, the horizontal axis shows the frequency and the vertical axis shows the return loss. In the unit of horizontal axis, for example, 1.E+09 means $1 \times 10^9$, that is 1 G (giga).

TABLE 1

|  | Ex. 1 | Ex. 2 | Ex. 3 | Ex. 4 | Ex. 5 |
|---|---|---|---|---|---|
| Organic matrix (vol %) | 32 | 32 | 32 | 32 | 32 |
| Thermally conductive filler (vol %) | 28 | 28 | 28 | 28 | 63 |
| Soft magnetic powder | 40 | 40 | 40 | 40 | 5 |
| Type | Fe—Si | Fe—Si | Fe—Si | Fe—Si | Fe—Si |
| Content of Silicon (wt %) | 6 | 7 | 6 | 6 | 6 |
| Average particle size (μm) | 10 | 10 | 3 | 50 | 10 |
| Viscosity of mixed composition (Pa · s) | 55.0 | 57.5 | 92.5 | 59.0 | 62.5 |
| Thermal conductivity of sheet (W/(m · K) | 3.0 | 2.7 | 2.6 | 3.0 | 3.1 |

TABLE 2

|  | Ex. 6 | Ex. 7 | Comp. 1 | Comp. 2 | Comp. 3 |
|---|---|---|---|---|---|
| Organic matrix (vol %) | 32 | 32 | 32 | 32 | 32 |
| Thermally conductive filler (vol %) | 48 | 8 | 28 | 28 | 68 |
| Soft magnetic powder | 20 | 60 | 40 | 40 | — |
| Type | Fe—Si | Fe—Si | Mn—Zn | Fe—Si | — |
| Content of Silicon (wt %) | 6 | 6 | — | 4.5 | — |
| Average particle size (μm) | 10 | 10 | 3 | 10 | — |
| Viscosity of mixed composition (Pa · s) | 55.0 | 90.0 | 125.0 | 57.5 | 65.0 |
| Thermal conductivity of sheet (W/(m · K) | 3.0 | 2.4 | 1.9 | 2.6 | 2.8 |

(Study)

All of the heat-radiating electromagnetic wave absorbing sheets of example 1 to 7, using Fe—Si alloy powder had excellent electromagnetic wave absorbing properties in quasi-microwave band and higher frequency ranges, especially in 1 GHz or more. Accordingly, it was proved that such sheets could match for quasi-microwave band and higher frequency ranges. Also, it was confirmed that the sheets of example 1 to 7 gave excellent thermal conductivities, which were 2.0 (W/(m·K)) or higher.

Contrastively, the heat-radiating electromagnetic wave absorbing sheet in comparative example 1 using Mn—Zn ferrite of prior art was poor in both of electromagnetic wave absorbing properties and thermal conductivity in comparison with the sheets by example 1 to 7. The sheet of example 2 using 4.5 wt % of Fe—Si alloy powder had less electromagnetic wave absorbing properties than that of examples 1 to 7, although it had better thermal conductivity. In the comparative example 2, a degradation of the thermal conductivity over time is also concerned since its Fe—Si alloy can be oxidized easily. Moreover, the sheet of comparative example 3, which does not contain Fe—Si alloy powder, did not show any electromagnetic wave absorbing properties as can be seen obviously in FIG. 3, although its thermal conductivity was better.

It should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope and equivalence of the appended claims.

What is claimed is:

1. A heat-radiating electromagnetic wave absorber molded from a mixed composition comprising soft magnetic powder and a thermally conductive filler in an organic matrix, wherein the soft magnetic powder includes Fe—Si alloy powder in which the content of silicon is in the range of from 5 to 7 percent by weight.

2. The heat-radiating electromagnetic wave absorber according to claim 1, wherein the average particle size of the Fe—Si alloy powder is in the range of from 1 to 50 μm.

3. The heat-radiating electromagnetic wave absorber according to claim 1, wherein the content of the soft magnetic powder in the mixed composition is in the range of from 5 to 70 percent by volume.

4. The heat-radiating electromagnetic wave absorber according to claim 1, wherein the organic matrix is a silicone gel.

5. The heat-radiating electromagnetic wave absorber according to claim 1, wherein the thermally conductive filler is selected from the group consisting of metal oxides, metal nitrides, metal carbonates, metal hydrides, and combinations thereof.

6. The heat-radiating electromagnetic wave absorber according to claim 1, wherein the thermally conductive filler is selected from the group consisting of silver, copper, gold, iron, aluminum, magnesium, their alloys, and combinations thereof.

7. The heat-radiating electromagnetic wave absorber according to claim 1, wherein the thermal conductivity of said heat-radiating electromagnetic wave absorber is at least 2.0 W/(m·K).

8. The heat-radiating electromagnetic wave absorber according to claim 1 wherein said heat-radiating electromagnetic wave absorber is in the form of a sheet.

9. The heat-radiating electromagnetic wave absorber according to claim 8, wherein the thickness of the sheet is in the range of 0.2 to 5 mm.

10. The heat-radiating electromagnetic wave absorber according to claim 8, wherein the sheet has at least one adhesive surface.

11. A mixed composition comprising soft magnetic powder and a thermally conductive filler in an organic matrix, wherein the soft magnetic powder includes Fe—Si alloy powder in which the content of silicon is in the range of from 5 to 7 percent by weight.

12. The mixed composition according to claim 11, wherein the average particle size of the Fe—Si alloy powder is in the range of from 1 to 50 μm.

13. The mixed composition according to claim 11, wherein the content of the soft magnetic powder in the mixed composition is in the range of from 5 to 70 percent by volume.

14. The mixed composition according to claim 11, wherein the organic matrix is a silicone gel.

15. The mixed composition according to claim 11, wherein the thermally conductive filler is selected from the group consisting of metal oxides, metal nitrides, metal carbonates, metal hydrides, and combinations thereof.

16. The mixed composition according to claim 11, wherein the thermally conductive filler is selected from the group consisting of silver, copper, gold, iron, aluminum, magnesium, their alloys, and combinations thereof.

17. The mixed composition according claim 11, wherein the thermal conductivity of said mixed composition is at least 2.0 W/(m·K).

* * * * *